(12) United States Patent
Miyazaki et al.

(10) Patent No.: US 8,987,124 B2
(45) Date of Patent: Mar. 24, 2015

(54) METHOD OF MANUFACTURING SCHOTTKY BARRIER DIODE

(71) Applicant: Sumitomo Electric Industries, Ltd., Osaka-shi, Osaka (JP)

(72) Inventors: Tomihito Miyazaki, Osaka (JP); Toru Hiyoshi, Osaka (JP)

(73) Assignee: Sumitomo Electric Industries, Ltd., Osaka-Shi, Osaka (JP)

( * ) Notice: Subject to any disclaimer, the term of this patent is extended or adjusted under 35 U.S.C. 154(b) by 260 days.

(21) Appl. No.: 13/649,383

(22) Filed: Oct. 11, 2012

(65) Prior Publication Data
US 2013/0122696 A1 May 16, 2013

Related U.S. Application Data

(60) Provisional application No. 61/559,501, filed on Nov. 14, 2011.

(30) Foreign Application Priority Data

Nov. 14, 2011 (JP) ................................. 2011-248294

(51) Int. Cl.
- *H01L 21/44* (2006.01)
- *H01L 29/66* (2006.01)
- *H01L 29/872* (2006.01)
- *H01L 29/16* (2006.01)

(52) U.S. Cl.
CPC ........ *H01L 29/66143* (2013.01); *H01L 29/872* (2013.01); *H01L 29/1608* (2013.01); *Y10S 438/931* (2013.01)

USPC .............. 438/572; 257/E21.06; 257/E21.064; 257/E21.186; 257/E21.359; 438/92; 438/571; 438/579; 438/582; 438/770; 438/931

(58) Field of Classification Search
USPC ..................... 257/E21.06, E21.064, E21.186, 257/E21.359; 438/92, 571, 572, 579, 582, 438/770, 931
See application file for complete search history.

(56) References Cited

U.S. PATENT DOCUMENTS

2009/0096053 A1* 4/2009 Tsuchida et al. .............. 257/486
2011/0220913 A1 9/2011 Hatakeyama

FOREIGN PATENT DOCUMENTS

JP 2011187767 A 9/2011

* cited by examiner

*Primary Examiner* — Asok K Sarkar
(74) *Attorney, Agent, or Firm* — Drinker Biddle & Reath LLP

(57) ABSTRACT

A silicon carbide substrate having a main face is prepared. By applying thermal oxidation to the main face of the silicon carbide substrate at a first temperature, an oxide film is formed on the main face. After the oxide film is formed, heat treatment is applied to the silicon carbide substrate at a second temperature higher than the first temperature. An opening exposing a portion of the main face is formed at the oxide film. A Schottky electrode is formed on the main face exposed by the opening.

5 Claims, 2 Drawing Sheets

METHOD OF MANUFACTURING SCHOTTKY BARRIER DIODE

This application claims the benefit of U.S. Provisional Application No. 61/559,501 filed Nov. 14, 2011, which is incorporated by reference herein in the entirety.

BACKGROUND OF THE INVENTION

1. Field of the Invention

The present invention relates to a method of manufacturing a Schottky barrier diode, more particularly, a method of manufacturing a Schottky barrier diode having a silicon carbide substrate.

2. Description of the Background Art

According to Japanese Patent Laying-Open No. 2011-187767, for example, a Schottky barrier diode is formed at a SiC semiconductor layer that has been grown epitaxially on a SiC semiconductor substrate. The top face of the SiC semiconductor layer is covered with a silicon oxide film having an opening formed. A Schottky electrode is formed on the SiC semiconductor layer at this opening region. An anode electrode is formed on the Schottky electrode. A cathode electrode is formed at the backside of the SiC semiconductor substrate.

When Schottky barrier diodes are manufactured industrially, inspection is generally made to identify that the leakage current is below a specified value. The yield from the inspection was not high enough according to the conventional manufacturing method.

SUMMARY OF THE INVENTION

In view of the foregoing, an object of the present invention is to provide a method of manufacturing a Schottky barrier diode that can suppress leakage current.

A method of manufacturing a Schottky barrier diode of the present invention includes the steps of: preparing a silicon carbide substrate having a main face, forming an oxide film on the main face by applying thermal oxidation to the main face of the silicon carbide substrate at a first temperature, applying heat treatment to the silicon carbide substrate at a second temperature higher than the first temperature after the oxide film is formed, forming an opening at the oxide film to expose a portion of the main face, and forming a Schottky electrode on the main face exposed by the opening.

By subjecting the silicon carbide substrate to heat treatment at a second temperature higher than the first temperature according to the present manufacturing method, leakage current of the Schottky barrier diode can be suppressed.

Preferably, the opening of the oxide film is formed after the silicon carbide substrate is subjected to heat treatment. Accordingly, the region at the main face of the silicon carbide substrate corresponding to the opening, i.e. the region that will be brought into contact with the Schottky electrode, is protected by being covered with the oxide film during heat treatment. Since this region is spared from being damaged during heat treatment, a more ideal Schottky junction is formed on this region, subsequent to formation of the opening. Therefore, leakage current caused by an insufficient Schottky barrier can be suppressed. Thus, the leakage current of the Schottky barrier diode can be further suppressed.

Preferably, the silicon carbide substrate is subjected to heat treatment in an inert gas atmosphere. Accordingly, the leakage current of the Schottky barrier diode can be further suppressed.

Preferably, the second temperature is higher than the first temperature by 50° C. or more. Accordingly, the leakage current of the Schottky barrier diode can be further suppressed sufficiently.

Preferably, an ohmic electrode is formed on a face of the silicon carbide substrate opposite to the main face. Accordingly, the ohmic electrode can be located remote from the main face of the silicon carbide substrate. Thus, current can be conducted in the vertical direction, allowing high-amperage current.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

Figure 1:
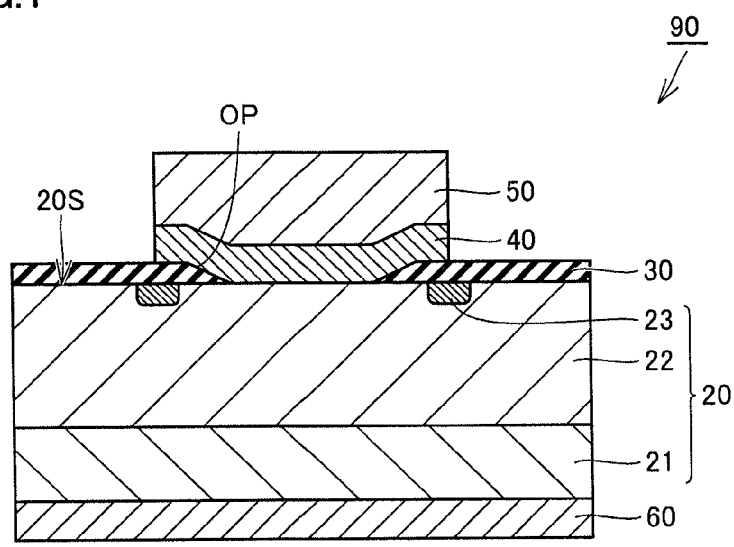
FIG. 1 is a schematic sectional view of a configuration of a Schottky barrier diode according to an embodiment of the present invention.

As shown in FIG. 1, a Schottky barrier diode 90 according to the present embodiment includes an epitaxial substrate 20, an oxide film 30, a Schottky electrode 40, an interconnection layer 50, and an ohmic electrode 60.

Epitaxial substrate 20 includes a single crystal substrate 21, and an epitaxial layer 22 provided on single crystal substrate 21. Single crystal substrate 21 is made of silicon carbide, and has n type conductivity. Epitaxial layer 22 is made of silicon carbide, and has n type conductivity. The impurity included in epitaxial layer 22 is nitrogen, for example. The impurity concentration of epitaxial layer 22 is lower than that of single crystal substrate 21. Epitaxial substrate 20 has a main face 20S at the side where epitaxial layer 22 is formed.

Oxide film 30 that is a thermal oxidation film is formed on main face 20S of epitaxial substrate 20. Oxide film 30 has an opening OP.

Schottky electrode 40 is formed such that at least a portion thereof is brought into contact with main face 20S exposed by opening OP. In the present embodiment, Schottky electrode 40 is provided to encompass opening OP in plan view. Therefore, Schottky electrode 40 has one portion provided directly on main face 20S in opening OP, whereas the other portion is provided on main face 20S with oxide film 30 therebetween. As a result, the region of Schottky electrode 40 in contact with main face 20S is defined by opening OP of oxide film 30. For the material of Schottky electrode 40, Ti, W or Ni, for example, can be cited.

Interconnection layer 50 is provided on Schottky electrode 40 so as to avoid contact with epitaxial substrate 20. The material of interconnection layer 50 includes Al, for example.

Ohmic electrode 60 is formed on epitaxial substrate 20 at a side opposite to main face 20S, i.e. formed on single crystal substrate 21. The material of ohmic electrode 60 includes NiSi, for example.

In the present embodiment, a guard ring region 23 formed by applying impurities onto main face 20S is provided at epitaxial substrate 20. The conductivity type of guard ring region 23 differs from the conductivity type of epitaxial layer 22. Guard ring region 23 is arranged to surround opening OP in plan view.

A method of manufacturing Schottky barrier diode 90 will be described hereinafter.

Figure 2:
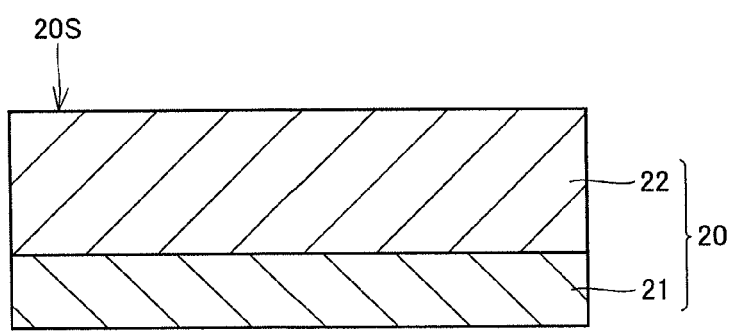
FIGS. 2-6 are sectional views schematically representing first to fifth steps, respectively, in a method of manufacturing a Schottky barrier diode according to an embodiment of the present invention.

As shown in FIG. 2, epitaxial substrate 20 is prepared by forming epitaxial layer 22 on single crystal substrate 21.

Figure 3:
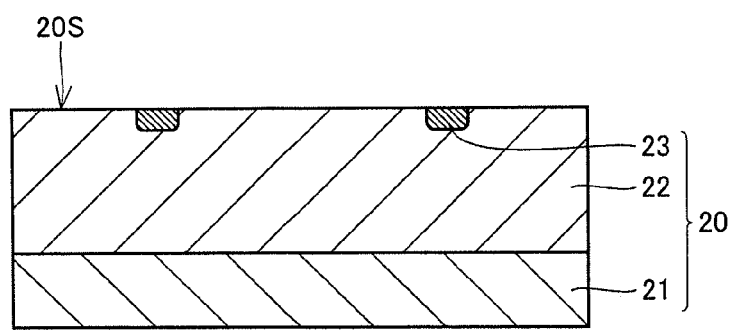

As shown in FIG. 3, guard ring region 23 is formed by implanting impurity ions onto main face 20S.

Figure 4:
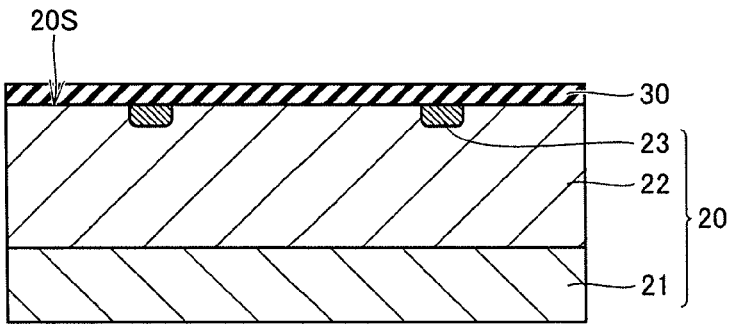

As shown in FIG. 4, main face 20S of epitaxial substrate 20 is subjected to thermal oxidation to form oxide film 30 on main face 20S. This thermal oxidation is carried out by heating epitaxial substrate 20 up to a first temperature in an atmosphere including oxygen atoms. From the standpoint of achieving a sufficiently high rate of thermal oxidation, the first temperature is preferably greater than or equal to 900° C., more preferably greater than or equal to 1100° C. From the standpoint of ensuring a selecting range of a second temperature that will be described afterwards, the first temperature is preferably less than 1200° C. For example, in order to form an oxide film 30 to a thickness of 100 nm, epitaxial substrate 20 is maintained at a temperature of 1100° C. for 6 hours in an atmosphere including oxygen gas.

Figure 5:
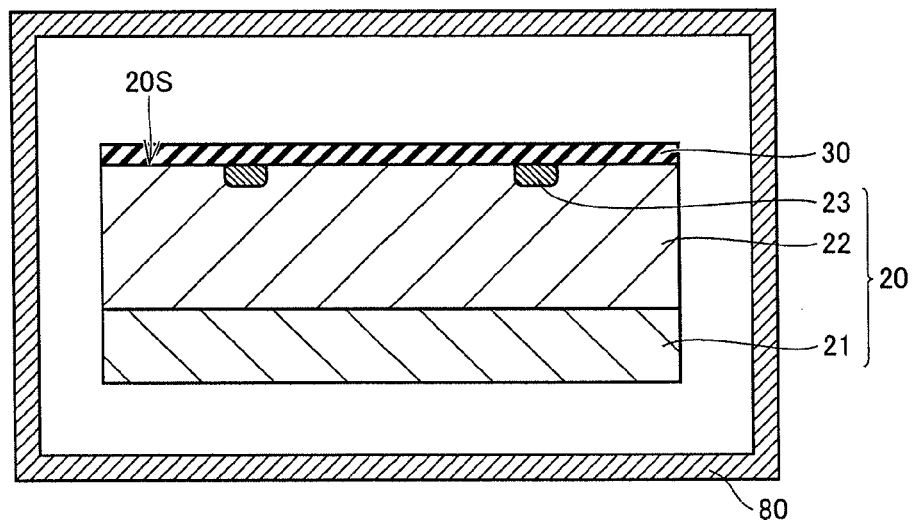

As shown in FIG. 5, epitaxial substrate 20 having oxide film 30 formed is placed in a heat-treating furnace 80. Using heat-treating furnace 80, epitaxial substrate 20 is heat-treated at a second temperature higher than the first temperature. The second temperature is higher than the first temperature preferably by 50° C. or more, more preferably by 100° C. or more. In order to use a heat-treating furnace 80 of a simple type, the second temperature is preferably less than or equal to 1300° C., more preferably less than or equal to 1200° C. It is to be noted that using a heat-treating furnace 80 made of quartz, for example, at a temperature greater than or equal to approximately 1200° C. will readily exhibit significant degradation.

Preferably, the aforementioned heat treatment of epitaxial substrate 20 is carried out in an atmosphere of inert gas. For the inert gas, argon gas or nitrogen gas, for example, can be employed. The heat treatment is carried out for approximately one hour at approximately 1200° C., for example.

Figure 6:
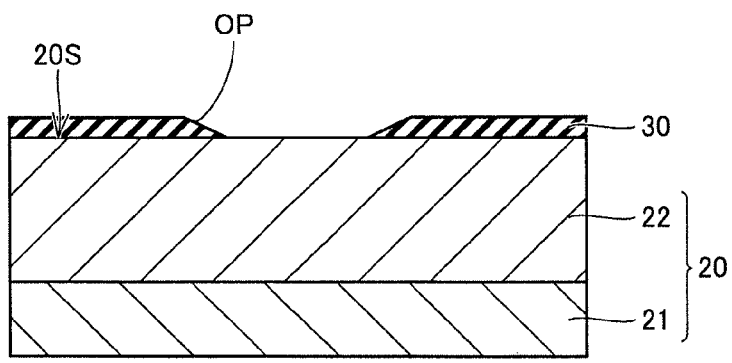

As shown in FIG. 6, opening OP exposing a portion of main face 20S is formed at oxide film 30. This formation may be carried out by photolithography and etching, for example.

Referring to FIG. 1 again, Schottky electrode 40 is formed on main face 20S exposed by opening OP. Interconnection layer 50 is formed on Schottky electrode 40. Ohmic electrode 60 is formed on a face of epitaxial substrate 20 opposite to main face 20S. Thus, Schottky barrier diode 90 is obtained.

A method of testing Schottky barrier diode 90 will be described hereinafter. A predetermined reverse voltage (withstand voltage) is applied across interconnection layer 50 and ohmic electrode 60. The current flowing between interconnection layer 50 and ohmic electrode 60 under the state where such voltage is applied is measured as the leakage current. When a value of this leakage current divided by the area where Schottky junction is formed exceeds a specified value, Schottky barrier diode 90 is determined to be not acceptable.

An example of the results of the aforementioned testing method will be described hereinafter. Under the condition that the aforementioned specified value is $1 \times 10^{-3}$ (A/cm$^2$) and the withstand voltage is 600V in association with the leakage current, 151 Schottky barrier diodes 90 were tested, among which 71 were not acceptable. Therefore, the yield was (151−71)/151=53%. As a comparative example, Schottky barrier diodes manufactured according to a manufacturing method absent of the above-described heat treatment were subjected to similar testing. In the comparative example, 80 among 151 Schottky barrier diodes were not acceptable. Therefore, the yield was (151−80)/151=47%.

Furthermore, under the condition of 500V for the withstand voltage, 151 Schottky barrier diodes 90 were tested, among which 49 were not acceptable. Therefore, the yield was (151−49)/151=68%. As a comparative example, Schottky barrier diodes manufactured according to a manufacturing method absent of the above-described heat treatment were subjected to similar testing. In the comparative example, 64 among 151 Schottky barrier diodes were not acceptable. Therefore, the yield was (151−64)/151=58%.

The temperature of thermal oxidation in the steps of manufacturing the diodes was set at 1200° C. In the examples, the temperature of heat treatment carried out after thermal oxidation was 1250° C.

As appreciated from the examples set forth above, leakage current of Schottky barrier diode 90 (FIG. 1) can be suppressed by subjecting epitaxial substrate 20 to heat treatment at a temperature higher than the temperature of thermal oxidation for forming oxide film 30 (FIG. 5) in the present embodiment. The reason why leakage current is suppressed may be due to the higher electrical resistance at the interface between epitaxial substrate 20 and oxide film 30, as compared to the case where heat treatment is not carried out. This is probably because the interface state density at the interface between epitaxial substrate 20 and oxide film 30 is reduced. A likely reason thereof is that the number of atoms, present at the interface between oxide film 30 and epitaxial substrate 20 (SiO$_2$/SiC interface) and constituting dangling bonds, is reduced by the heat treatment. Possibly, the atoms constituting dangling bonds are diffused by the heat treatment at the second temperature higher than the first temperature. After occurrence of such diffusion, it is considered that the thickness of the layer formed of atoms constituting dangling bonds, i.e. the interface transition layer, is reduced down to approximately several atomic layers.

Opening OP is formed after epitaxial substrate 20 is subjected to heat treatment. Therefore, the portion of epitaxial substrate 20 corresponding to opening OP at main face 20S, i.e. the region to be brought into contact with Schottky electrode 40, is covered with oxide film 30 during the heat treatment to be protected. Since this region is spared from being damaged during heat treatment, a more ideal Schottky junction is formed on this region, subsequent to formation of the opening. Therefore, leakage current caused by an insufficient Schottky barrier can be suppressed. Thus, the leakage current of Schottky barrier diode 90 can be further suppressed.

Epitaxial substrate 20 is heat-treated in an inert gas atmosphere. Accordingly, leakage current of Schottky barrier diode 90 can be further suppressed. The reason why leakage current is further suppressed may be due to the fact that a new impurity level is less likely to be generated during heat treatment by employing inert gas atmosphere.

Further, ohmic electrode 60 is formed on a face of epitaxial substrate 20 opposite to main face 20S. Accordingly, ohmic electrode 60 can be located remote from main face 20S of epitaxial substrate 20. This allows current to be conducted in the vertical direction, allowing a high-amperage current.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a Schottky barrier diode, comprising the steps of:

preparing a silicon carbide substrate having a main face, forming an oxide film on said main face by applying thermal oxidation to said main face of said silicon carbide substrate at a first temperature, applying heat treatment to said silicon carbide substrate and said oxide film at a second temperature higher than the first temperature, after said step of forming an oxide film, forming an opening at said oxide film exposing a portion of said main face, and forming a Schottky electrode on said main face exposed by said opening such that said Schottky electrode is in contact with said oxide film.

2. The method of manufacturing a Schottky barrier diode according to claim 1, wherein said step of forming an opening is carried out after said step of applying heat treatment to said silicon carbide substrate.

3. The method of manufacturing a Schottky barrier diode according to claim 1, wherein said step of applying heat treatment to said silicon carbide substrate is carried out in an inert gas atmosphere.

4. The method of manufacturing a Schottky barrier diode according to claim 1, wherein said second temperature is higher than said first temperature by 50° C. or more.

5. The method of manufacturing a Schottky barrier diode according to claim 1, further comprising the step of forming an ohmic electrode on a face of said silicon carbide substrate opposite to said main face.

\* \* \* \* \*